(12) United States Patent
Chen et al.

(10) Patent No.: US 7,465,626 B2
(45) Date of Patent: Dec. 16, 2008

(54) METHOD FOR FORMING A HIGH-K DIELECTRIC STACK

(75) Inventors: Peijun Jerry Chen, Dallas, TX (US); Tsai Wilman, Saratoga, CA (US); Mathieu Caymax, Leuven (BE); Jan Willem Maes, Wilrijk (BE)

(73) Assignees: Interuniversitair Microelektronica Centrum vzw, Leuven (BG); ASM America Inc., Phoenix, AZ (US)

( * ) Notice: Subject to any disclaimer, the term of this patent is extended or adjusted under 35 U.S.C. 154(b) by 261 days.

(21) Appl. No.: 11/138,746

(22) Filed: May 25, 2005

(65) Prior Publication Data

US 2005/0269651 A1    Dec. 8, 2005

Related U.S. Application Data

(63) Continuation of application No. PCT/BE03/00213, filed on Dec. 9, 2003.

(60) Provisional application No. 60/431,824, filed on Dec. 9, 2002.

(51) Int. Cl.
*H01L 21/31* (2006.01)
*H01L 21/8242* (2006.01)

(52) U.S. Cl. .................. 438/240; 438/778; 438/785

(58) Field of Classification Search ............... 438/240, 438/785, 786

See application file for complete search history.

(56) References Cited

U.S. PATENT DOCUMENTS 6,251,761 B1    6/2001  Rodder et al.
6,642,573 B1 *  11/2003 Halliyal et al. .............. 257/316
6,645,882 B1 *  11/2003 Halliyal et al. .............. 438/785
6,759,323 B2 *  7/2004  Kirchhoff ................... 438/627
2002/0024139 A1  2/2002 Chan et al.
2002/0130340 A1  9/2002 Horisuch et al.
2002/0151142 A1 10/2002 Callegari et al.
2003/0070617 A1 * 4/2003 Kim et al. ................... 118/715

OTHER PUBLICATIONS

Allaert, K. et al., *A Comparison Between Silicon Nitride Films Made by PCVD of N2-SIH4/AR amd N2-SIH4/HE*, Journal of the Electrochemical Society Electrochemical Society vol. 132 No. 7 Jul. 1985 pp. 1763-1766l; XP000840429.

* cited by examiner

*Primary Examiner*—Thanh Nguyen
(74) *Attorney, Agent, or Firm*—Knobbe Martens Olson & Bear LLP (57) ABSTRACT

The present invention provides a method for fabricating a dielectric stack in an integrated circuit comprising the steps of (i) forming a high-k dielectric layer on a semiconductor substrate, (ii) subjecting the semiconductor substrate with the high-k dielectric layer to a nitrogen comprising vapor phase reactant and silicon comprising vapor phase reactant in a plasma-enhanced chemical vapor deposition process (PECVD) or a plasma-enhanced atomic layer chemical vapor deposition (PE ALCVD) process. Furthermore, the present invention provides a dielectric stack in an integrated circuit comprising (i) a high-k dielectric layer comprising at least a high-k material, (ii) a dielectric layer comprising at least silicon and nitrogen; (iii) an intermediate layer disposed between the high-k dielectric layer and the dielectric layer, the intermediate layer comprising the high-k material, silicon, and nitrogen.

15 Claims, 10 Drawing Sheets

METHOD FOR FORMING A HIGH-K DIELECTRIC STACK

RELATED APPLICATIONS

This application is a continuation, under 35 U.S.C. § 120, of International Patent Application No. PCT/BE2003/000213, filed on Dec. 9, 2003 under the Patent Cooperation Treaty (PCT), which was published by the International Bureau in English on Jun. 24, 2004, which designates the United States and claims the benefit of United States Provisional Patent Application No. 60/431,824, filed Dec. 9, 2002. All above-referenced prior applications are incorporated by reference herein in their entirety and are hereby made a portion of this specification.

FIELD OF THE INVENTION

The present invention relates to integrated circuit fabrication processes and in particular to the formation of an integrated circuit comprising a multilayer dielectric stack of high-k material. The present invention further relates to such dielectric stack in an integrated circuit and to a MOS transistor having such multilayer dielectric stack.

BACKGROUND OF THE INVENTION

A multilayer dielectric stack according to the present invention replaces prior art silicon dioxide as dielectric layer in integrated circuits.

When integrating a high-k dielectric with a gate electrode into a conventional CMOS gate stack, two major process/thermal stability issues need to be addressed and tackled. It is hereby important to 1. Reduce reaction(s) at the top interface between the high-k dielectric and the gate electrode such as polysilicon either during polysilicon deposition and/or during subsequent thermal processing and/or to
2. Minimize degradation of high-k material integrity due to crystallization, which leads to formation of structural defects such as oxygen vacancies and grain boundaries that interact with gate electrode deposition process leading to pathways of enhanced electrical leakage and/or of dopant/impurity diffusion.

Based upon knowledge from conventional $SiO_2$-based CMOS gate dielectric material (which is amorphous and 100% compatible with polysilicon gate), it is known that nitrogen is a key modifier introduced to improve the resistance against boron diffusion. Likewise, in high-k dielectric, enhanced stability against dopant (boron) diffusion from the polysilicon gate can be achieved through the use of a metal-oxynitride ($MO_xN_y$) or nitridation of metal oxide (U.S. Pat. No. 6,251,761). U.S. Pat. No. 6,251,761 describes a gate stack including a gate dielectric with reduced effective electrical thickness. A high-k dielectric is deposited over the silicon substrate. In a next step, remote plasma nitridation of the high-k dielectric layer is performed to convert the upper surface of the high-k dielectric into a nitride layer. A conductive layer is formed over the nitride layer to complete the CMOS gate stack.

Published U.S. patent application No. 2002/0130340 A1 discloses a multilayer dielectric stack, which has alternating layers of high-k material and an interposing material. The interposing material can be $Al_2O_3$, AlN, SiN, $Si_3N_4$ and $SiO_2$. The interposing material can be deposited by atomic layer deposition, sputtering or evaporation, resulting in the deposition of the interposing layer on the dielectric layer. Each layer is preferably less tan 50 Angstroms thick. This structure inhibits and prevents the crystallization of the high k-material.

SUMMARY OF THE INVENTION

In a first aspect of this invention, a method for forming a dielectric stack in an integrated circuit structure is disclosed comprising the steps of:
  forming a high-k dielectric layer on a semiconductor substrate, and
  subjecting the semiconductor substrate with the high-k dielectric layer to a nitrogen comprising vapor phase reactant and a silicon comprising vapor phase reactant in a plasma-enhanced chemical vapor deposition process (PECVD) or plasma-enhanced atomic layer chemical vapor deposition (PE ALCVD) process.

With a process according to the present invention, highly reactive species such as nitrogen ions or radicals and silicon species penetrate into the upper part of the high-k material, thereby promoting intermixing, densification and formation of an intermediate layer. The intermediate layer comprises at least the high-k material, silicon and nitrogen. Highly reactive species are formed by plasma-enhanced chemical vapor deposition (PECVD) or plasma-enhanced atomic layer chemical vapor deposition (PE ALCVD). Highly reactive species can be radicals or ions. Consequently, using PECVD or PE ALCVD, the species formed in the plasma penetrate into the upper part of the underlying high-k dielectric layer.

The presence of both silicon and nitrogen contributes to the compatibility between the high-k dielectric layer and any other layer such as e.g. the gate electrode.

Compared to prior art methods, the formation of an interfacial layer between the high-k dielectric layer and e.g. the gate electrode layer is avoided, thus leading to improved electrical properties.

In an embodiment of the first aspect of this invention, a method as recited in any of the previous embodiments is disclosed wherein the subjecting step results in the formation of a dielectric layer comprising at least silicon and nitrogen and essentially no or no high-k material and in the formation of an intermediate layer disposed between the high-k dielectric layer and the dielectric layer, the intermediate layer comprising at least the high-k material, silicon and nitrogen.

In a preferred embodiment, the dielectric layer is selected from the group consisting of SiN, SiON and $Si_3N_4$.

In another embodiment of the first aspect of this invention, a method as recited in any of the previous embodiments is disclosed wherein the subjecting step results in the formation of an intermediate layer adjacent to the high-k dielectric layer and the dielectric layer, the intermediate layer comprising at least the high-k material, silicon and nitrogen. Preferably, the intermediate layer is on top of the high-k dielectric layer. The subjecting step results in essentially no and/or no formation at all of the dielectric layer (in the case of very thin layers).

In an embodiment of the first aspect of this invention, a method as recited in any of the previous embodiments is disclosed further comprising subjecting the substrate with the high-k dielectric layer to an oxygen comprising vapor phase reactant. In this case, the intermediate layer formed comprises oxygen in addition.

In a preferred embodiment, the silicon comprising compound or vapor phase reactant is selected from the group consisting of $SiH_4$, $Si_2H_6$, $Si_3H_8$, $Si_xH_yCl_z$ and combinations thereof. In another preferred embodiment, the nitrogen comprising compound is selected from the group consisting of nitrogen, ammonia, $N_2H_4$, NO, $N_2O$, and combinations thereof. In a further embodiment of the first aspect of this invention, a method as recited in any of the previous embodiments is disclosed wherein the ratio of silane:nitrogen containing compounds is in the range of 1:1 to 1:10000. Preferably, the ratio is between 1:1 and 1:1000.

In an embodiment of the first aspect of this invention, a method as recited in any of the previous embodiments is disclosed further comprising repeating the forming step and the subjecting step between 2 and 100 times, between 2 and 50 times, between 10 and 50 times, between 10 and 30 times and between 2 and 10 times.

In an embodiment of the first aspect of this invention, a method as recited in any of the previous embodiments is disclosed wherein the high-k dielectric layer comprises a high-k material selected from the group consisting of a transition metal or lanthanide oxide and a transition metal or lanthanide oxynitride. In a preferred embodiment, the high-k material is selected from the group consisting of $ZrO_2$, $HfO_2$, $TiO_2$, $Ta_2O_5$, $Al_2O_3$, $HfO_xN_y$, HfN, $La_xO_y$, $LaAlO_3$, and/or mixtures thereof.

In a preferred embodiment of the invention, the forming step comprises subjecting the semiconducting substrate to an atomic layer deposition process.

In a preferred embodiment, the high-k material is selected from the group consisting of $HfO_2$, $HfO_xN_y$ and HfN.

In an embodiment of the first aspect of this invention, a method as recited in any of the previous embodiments is disclosed wherein the subjecting step is performed in a plasma-enhanced chemical vapor deposition (PECVD) chamber at a temperature in the range of 300 to 600 degrees Celsius.

In a further embodiment of the first aspect of this invention, a method as recited in any of the previous embodiments is disclosed wherein the subjecting step is performed in a plasma-enhanced atomic layer chemical vapor deposition chamber at a temperature in the range of 300 to 600 degrees Celsius. The semiconductor substrate with the high-k dielectric layer is subjected to alternating pulses of precursor compounds, the precursor compound being a nitrogen containing vapor phase reactant or a silicon containing vapor phase reactant.

In a further embodiment of the first aspect of this invention, a method as recited in any of the previous embodiments is disclosed wherein the subjecting step is performed at a pressure in the range of $10^{-3}$ to 100 Torr. The pressure can vary, depending on the composition of reactants. For $N_2$ as reactant, the pressure is preferably between 0.01 and 100 Torr, while for a silane reactant, the pressure is between 1 and 100 mTorr.

In a further embodiment of the first aspect of this invention, a method as recited in any of the previous embodiments is disclosed wherein the subjecting step is performed in a plasma with a plasma density in the range of $10^{10}$ to $10^{13}$ reactive species $cm^{-3}$.

In another embodiment of the first aspect of this invention, a method as recited in any of the previous embodiments is disclosed wherein the high-k dielectric layer has a thickness in the range of 0.01 nm to 20 nm, 0.05 nm to 20 nm, 0.1 nm to 20 nm, 0.3 nm to 20 nm, 0.5 nm to 20 nm. The dielectric layer has a thickness in the range of 0.01 nm to 20 nm, 0.05 nm to 20 nm, 0.1 nm to 20 nm, 0.3 nm to 20 nm, 0.5 nm to 20 nm. Preferably, the thickness is below 1 nm, below 0.5 nm and below 0.3 nm. According to an embodiment of the first aspect of this invention, the dielectric layer has a thickness between 0.01 nm and 1 nm, between 0.01 nm and 0.5 nm, between 0.01 nm and 0.1 nm.

In another embodiment of the first aspect of this invention, a method as recited in any of the previous embodiments is disclosed wherein the step of forming a high-k dielectric layer on a semiconductor substrate is performed by an atomic layer deposition process (ALD). In another embodiment of the first aspect of this invention, a method as recited in any of the previous embodiments is disclosed further comprising the step of annealing the semiconductor substrate at a temperature between 500 and 1000 degrees Celsius. Preferably, the substrate is annealed at a temperature between 600 and 900 degrees Celsius. The step of annealing can be performed after each individual step or can be performed after the formation of the dielectric stack.

The method as recited in the previous embodiments can further comprise the step of depositing a conductive layer over the dielectric stack. The conductive layer can comprise silicon. The conductive layer can be polysilicon, polysilicon germanium or a metal. In a subsequent step, the dielectric stack and the electrode layer are patterned to form the desired integrated circuit.

In a second aspect of the invention, a dielectric stack in an integrated circuit is provided. The dielectric stack comprises:
 a high-k dielectric layer comprising at least a high-k material; and
 an intermediate layer disposed between the high-k dielectric layer and the dielectric layer, the intermediate layer comprising the high-k material, silicon and nitrogen.

In a preferred embodiment of the second aspect of this invention, a device a recited in any of the previous embodiments is disclosed wherein the dielectric stack further comprises a dielectric layer comprising at least silicon and nitrogen.

In an embodiment of the second aspect of this invention, a device as recited in any of the previous embodiments is disclosed wherein the dielectric stack is characterized by a crystallization temperature, the crystallization temperature of the dielectric stack is higher than the crystallization temperature of the high-k material.

In a preferred embodiment of the second aspect of this invention, a dielectric stack as recited in any of the previous embodiments is disclosed wherein the crystallization temperature is between 800 degrees C. and 1200 degrees C.

In another embodiment of the second aspect of this invention, the intermediate layer and the dielectric layer are formed by subjecting the semiconductor substrate with the high-k dielectric layer to a nitrogen comprising vapor phase reactant and a silicon comprising vapor phase reactant in a plasma-enhanced chemical vapor deposition process (PECVD) or plasma-enhanced atomic layer chemical vapor deposition (PE ALCVD) process.

In another embodiment of the second aspect of this invention, the high-k layer is formed by subjecting the semiconductor substrate to an atomic layer deposition process.

In another embodiment of the second aspect of this invention, a dielectric stack as recited in any of the previous embodiments is disclosed wherein a sequence of the high-k dielectric layer, the intermediate layer and the dielectric layer is repeated between 3 and 60 times. In a preferred embodiment, a dielectric stack is provided wherein between one of the high-k dielectric layers and an adjacent one of the dielectric layers an intermediate layer is disposed, the intermediate layer comprising the dielectric material, silicon and nitrogen.

In another embodiment, the dielectric layer and the intermediate layer further comprise oxygen.

In another embodiment of the second aspect of this invention, a dielectric stack as recited in any of the previous embodiments is disclosed wherein the dielectric layer does essentially not comprise the high-k material. In a preferred embodiment, the intermediate layer comprises the high-k material, nitrogen and silicon and optionally oxygen. In another embodiment, the stack as recited in any of the previous embodiments comprises a dielectric layer selected from the group consisting of SiN, SiON, and $Si_3N_4$.

In another embodiment of the second aspect of this invention, a dielectric stack as recited in any of the previous embodiments is disclosed wherein the high-k dielectric layer comprises a compound selected from the group consisting of a transition metal oxide or a transition metal oxynitride. In a preferred embodiment, the high-k dielectric layer comprises a high-k dielectric material selected from the group consisting of $ZrO_2$, $HfO_2$, $TiO_2$, $Ta_2O_5$, $Al_2O_3$, $HfO_xN_y$, HfN and/or mixtures thereof. More preferably, the high-k dielectric material is selected from the group consisting of $HfO_2$, $HfO_xN_y$, and HfN.

In a further embodiment of the second aspect of this invention, a dielectric stack as recited in any of the previous embodiment is disclosed wherein the high-k dielectric layer has a thickness between 0.5 nm to 20 nm.

In a further embodiment of the second aspect of this invention, a dielectric stack as recited in any of the previous embodiment is disclosed wherein the dielectric layer has a thickness in the range of 0.01 nm to 20 nm, 0.05 nm to 20 nm, 0.1 nm to 20 nm, 0.3 nm to 20 nm, 0.5 nm to 20 nm. Preferably, the thickness is below 1 nm, below 0.5 nm and below 0.3 nm. According to an embodiment of the second aspect of this invention, the dielectric layer has a thickness between 0.01 nm and 1 nm, between 0.01 nm and 0.5 nm, between 0.01 nm and 0.1 nm.

In an embodiment of the invention, the intermediate layer comprises Hf, nitrogen and silicon and oxygen.

Preferably the dielectric layer of the stack is selected from the group consisting of SiN, SiON and $Si_3N_4$.

In a third aspect of this invention, a MOS transistor is disclosed. The MOS transistor comprises:
a gate electrode;
a channel region having an upper surface underlying the gate electrode; and
a dielectric stack being interposed between the gate electrode and the upper surface of the channel region, the dielectric stack comprising a high-k dielectric layer comprising at least a high-k material, a dielectric layer comprising at least silicon and nitrogen and an intermediate layer between the high-k dielectric layer and the dielectric layer, the intermediate layer comprising the high-k material, silicon and nitrogen.

The dielectric stack is characterized by the features as disclosed in the second aspect of the invention.

BRIEF DESCRIPTION OF THE DRAWINGS

The FIG. 1a represents a flow chart of a method of forming a dielectric stack according to a preferred embodiment of the invention.

The FIG. 1b represents a flow chart of a method of forming a dielectric stack according to another preferred embodiment of the invention.

The FIG. 2 represents a schematic view of a dielectric stack according to an embodiment of the present invention.

The FIG. 3 represents a schematic view of an integrated circuit structure according to an embodiment of the present invention.

The FIG. 4 represents a flow chart of a method of forming an integrated circuit according to a preferred embodiment of the invention.

The FIGS. 5a-d represent the results of capacitor leakage experiments for devices obtained according to various methods.

The FIGS. 6a-b represents a TEM picture of dielectric stacks obtained according to various methods.

The FIG. 7 represents a ToF-SIMS depth profile for a preferred embodiment of a device of the present invention.

The FIGS. 8a-c represents X-Ray diffraction spectra of devices obtained according to various methods.

The FIG. 9 represents channel electron mobility measurements from n-MOSFET devices obtained according to various methods.

The FIG. 10 represents the cumulative distribution of gate leakage current for 30 diode/capacitor devices obtained according to different methods.

DETAILED DESCRIPTION OF THE PREFERRED EMBODIMENTS

In relation to the appended drawings the present invention is described in details in the sequel. It is apparent however that a person skilled in the art can imagine several other equivalent embodiments or other ways of executing the present invention.

While the invention is described in conjunction with a MOS transistor, it will be apparent to those ordinary skilled in the art that the benefits of this invention can be applied to other transistor structures and other structures such as memory cell capacitors. In particular, one ordinary skilled in the art can imagine other situations where similar electrical and physical properties at an interface are desired.

For the purpose of this invention, a Plasma enhanced CVD or plasma enhanced ALCVD process should be understood as a process wherein at least one chemical compound is subjected to a plasma source, thereby creating highly reactive species such as radicals or ions.

The term high-k dielectric layer should be understood as a layer comprising a high-k material. A high-k material is a dielectric material having a dielectric constant greater than the dielectric constant of silicon oxide and preferably greater than 10.

The high-k material can be a high-k material selected from the group consisting of a transition metal oxide or a transition metal oxynitride, a rare earth metal oxide, a rare earth metal oxynitride. Transition metals can be Group IV or Group V metals such as e.g. Ti, Zr, Hf, V, Nb, and Ta. Rare earth metal can be Lanthanides such as e.g. So, Ce, Pr, Eu. Lanthanides meaning an element from the lanthanide series. High-k material can also include lanthanum oxide, neodymium oxide and cerium oxide. Preferably, the metal is Hafnium (Hf). Preferably, the high-k material is selected from the group consisting of $ZrO_2$, $HfO_2$, $TiO_2$, $Ta_2O_5$, $Al_2O_3$, $HfO_xN_y$, HfN and/or mixtures thereof. Preferably, the high-k material is $LaAlO_3$, $ZrO_2$ or $HfO_2$, more preferably $ZrO_2$ or $HfO_2$, more preferably $HfO_2$.

In a first aspect of this invention, a method for forming a dielectric stack is provided, the method comprising the steps of:
forming a high-k dielectric layer on a semiconductor substrate, and
subjecting the semiconductor substrate to nitrogen comprising vapor phase reactants and silicon comprising vapor phase reactants in a plasma-enhanced chemical vapor deposition process (PECVD) or plasma-enhanced-atomic layer chemical vapor deposition (PE ALCVD) process.

Preferably, the forming step and the subjecting step are repeated n times, such that a laminate structure is formed. n can be between 2 and 100, between 3 and 70, between 3 and 60, between 3 and 50, between 3 and 40, between 2 and 30, between 2 and 20, between 2 and 10.

The method can further comprise the step of depositing a gate electrode adjacent to the dielectric layer. Preferably, the gate electrode will be deposited on top of the dielectric layer. The gate electrode can be a conducting or semiconducting material such as poly Si or poly SiGe (polysilicon germanium).

The high-k dielectric layer can be formed by ALD, ALCVD, MOCVD (metalorganic chemical vapor deposition) or sputtering.

The plasma enhancement effect can be attributed to the enhanced reactivity of nitrogen containing species produced by the plasma, either as ions or as radicals. Energy released from ion bombardment or by radicals help to promote intermixing, densification and incorporation of silicon and nitrogen into the high-k dielectric layer. The presence of both silicon and nitrogen contributes to the compatibility between the high-k dielectric layer and the gate electrode.

The dielectric layer between the high-k dielectric layer and gate electrode contributes to minimize interfacial reactions between polysilicon and high-k dielectric layer at elevated temperature.

Figure 1A:
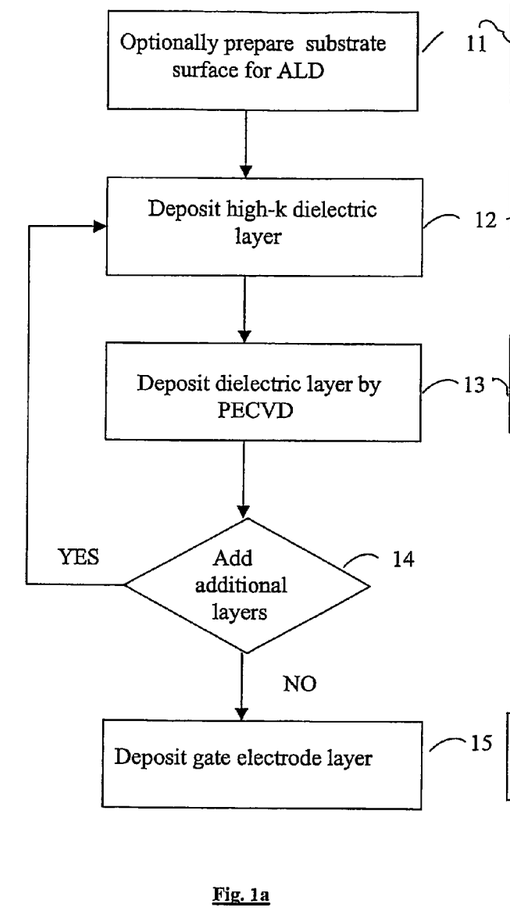

FIG. 1a illustrates an exemplary sequence for forming a dielectric stack in accordance with a preferred embodiment. The sequence is shown for transistor gate dielectric structures between a semiconductor substrate and a gate electrode. Initially, the semiconductor substrate can be treated for subsequential ALD deposition (11). Such a treatment can comprise water, alcohol or Ozone treatment, intended to create surface —OH groups as known to a person skilled in the art. Subsequently, a first high-k dielectric layer is deposited on the semiconductor substrate by ALD (12). A dielectric layer is deposited on the first high-k layer by PECVD (13). The dielectric layer comprises at least Si and N. This can be done in the same tool, but in different reaction chambers. This sequence of two steps can be repeated n times (14). Subsequently, a transistor gate electrode is deposited over the dielectric layer (15).

Optionally, a step of post deposition anneal can be performed before depositing the gate electrode layer to further improve the film integrity, to promote intermixing of individual components in the stack, and to further optimize oxygen-to-nitrogen ratio in the film stack.

Figure 1B:
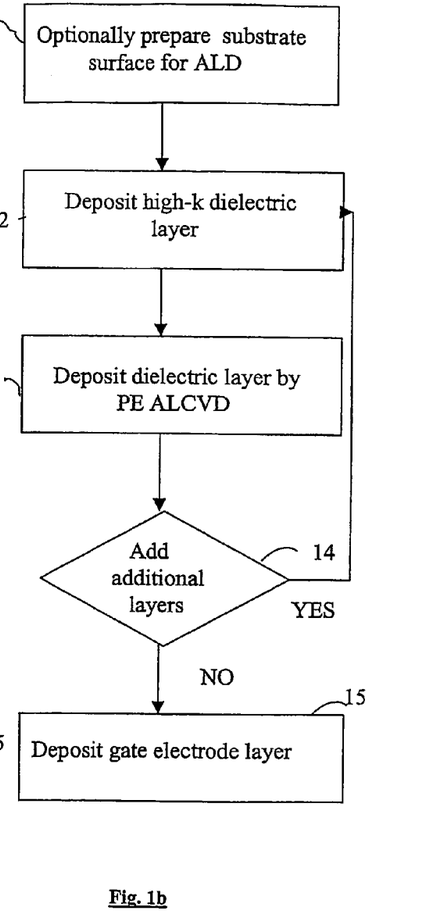

FIG. 1b illustrates another exemplary sequence for forming a dielectric stack in accordance with a preferred embodiment. The sequence is shown for transistor gate dielectric structures between a semiconductor substrate and a gate electrode. Initially, the semiconductor substrate can be treated for subsequential ALD deposition (11), as known by a person skilled in the art. Subsequently, a first high-k dielectric layer is deposited on the semiconductor substrate by ALD (12). A dielectric layer is deposited on the first high-k layer by PEAL-CVD (13). This step (13) comprises subjecting the substrate with the high-k dielectric layer to subsequent pulses of nitrogen comprising vapor phase reactants and silicon comprising vapor phase reactants. The dielectric layer comprises at least Si and N. This can be done in the same tool, but in different reaction chambers. This sequence of two steps can be repeated n times (14). Subsequently, a transistor gate electrode is deposited over the dielectric layer (15).

Optionally, a step of post deposition anneal can be performed before depositing the gate electrode layer to further improve the film integrity, to promote intermixing of individual components in the stack, and to further optimize oxygen-to-nitrogen ratio in the film stack.

Figure 2:
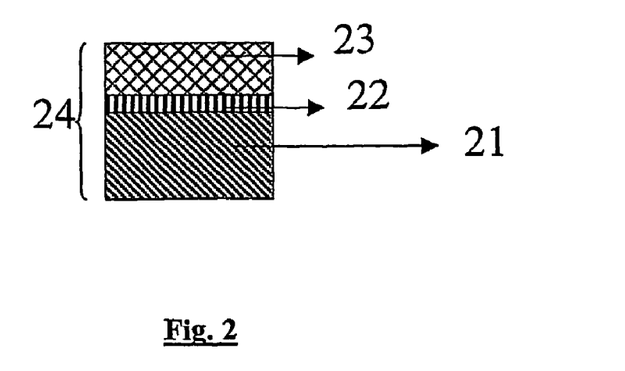

In a second aspect of this invention a dielectric stack for an integrated circuit is disclosed. In an embodiment, the dielectric stack is part of a transistor gate electrode structure. FIG. 2 depicts a cross section of such a structure. The dielectric stack (24) comprises a high-k dielectric layer (21) comprising at least a high-k material, a dielectric layer (23) comprising at least silicon and nitrogen and an intermediate layer (22) between the high-k dielectric layer and the dielectric layer, the intermediate layer comprising the high-k dielectric material, silicon and nitrogen. The dielectric stack (24) can be repeated n times.

Optionally, a dielectric layer can be deposited between the substrate and the high-k dielectric layer. This layer can have the same characteristics as the dielectric layer discussed above.

The crystallization temperature of the dielectric stack is higher than the crystallization temperature of the high-k dielectric layer. The crystallization temperature is higher than 600 degrees C., higher than 700 degrees C., preferably higher than 800 degrees C. and more preferably higher than 900 degrees C. The crystallization temperature is between 800 degrees C. and 1200 degrees C., between 800 degrees C. and 1100 degrees C., and preferably between 900 degrees C. and 1000 degrees C.

The silicon and nitrogen comprising dielectric layer provides a maximum barrier to prevent interfacial reaction between the high-k dielectric layer and the conductive layer (e.g. polysilicon gate electrode) compared to any dielectric stack consisting of a high-k dielectric layer such as $HfO_2$, $HfO_xN_y$, or HfSiON based single layer dielectric layer.

Figure 3:
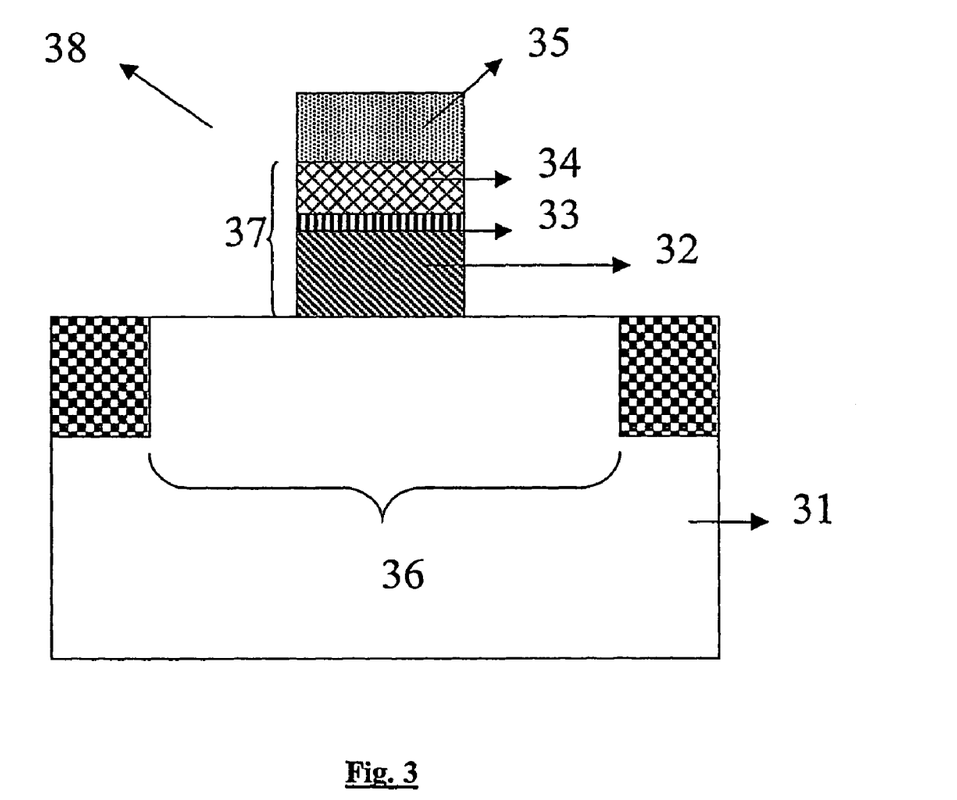

FIG. 3 illustrates an integrated circuit (IC) structure. The IC (38) is formed on a semiconductor substrate (31) above an active region (36). The IC comprises a dielectric stack (37) that replaces silicon dioxide dielectric layers as known in the prior art. The IC has a dielectric stack (37) being interposed between the gate electrode (35) and the upper surface of the active region (36). The dielectric stack consists of a high-k dielectric layer (32) comprising at least a high-k material, a dielectric layer (34) comprising at least silicon and nitrogen and an intermediate layer (33) between the high-k dielectric layer and the dielectric layer, the intermediate layer comprising the high-k material, silicon and nitrogen.

The high-k material is preferably $HfO_2$ or $ZrO_2$, while the dielectric layer consists preferably of $Si_3N_4$ or $Si_xO_yN_z$. The intermediate layer consists preferably of HfSiON produced by the plasma action in the PECVD or PE-ALCVD dielectric layer deposition process. This layer is preferably a mixture of the high-k material, silicon and nitrogen. This layer is preferably a mixture of the high-k material, silicon and nitrogen.

In a preferred embodiment, the layers 32, 33 and 34 will repeat.

In a preferred embodiment, the gate electrode (35) is polysilicon and more preferably polysilicon germanium.

The thickness of the high-k dielectric layer is between 0.5 nm to 20 nm, between 0.5 nm and 10 nm, between 0.5 nm and 5 nm, between 0.5 nm and 1 nm. The thickness of dielectric layer is between 0.5 to 20 nm, between 0.5 nm and 10 nm, between 0.5 nm and 5 nm, between 0.5 nm and 1 nm. The thickness of he intermediate layer can be between 0.01 nm 2 nm, between 0.01 nm and 1 nm, between 0.01 nm and 0.5 nm.

The present invention has the advantage that the incorporation of silicon and nitrogen into the high-k dielectric layer by forming an intermediate layer of metal-silicon oxynitride, leads to improved overall structural integrity and enhanced thermal stability.

The present invention has further the advantage that the gate oxide thickness can be minimized without sacrificing the yield of the integrate circuits. The dielectric stack as provided in this invention leads to excellent equivalent oxide thickness (EOT), while maintaining leakage current reduction benefits from the high-k dielectric layer, which is beneficial since it allows scaling integrated circuits and transistors in particular.

Figure 4:
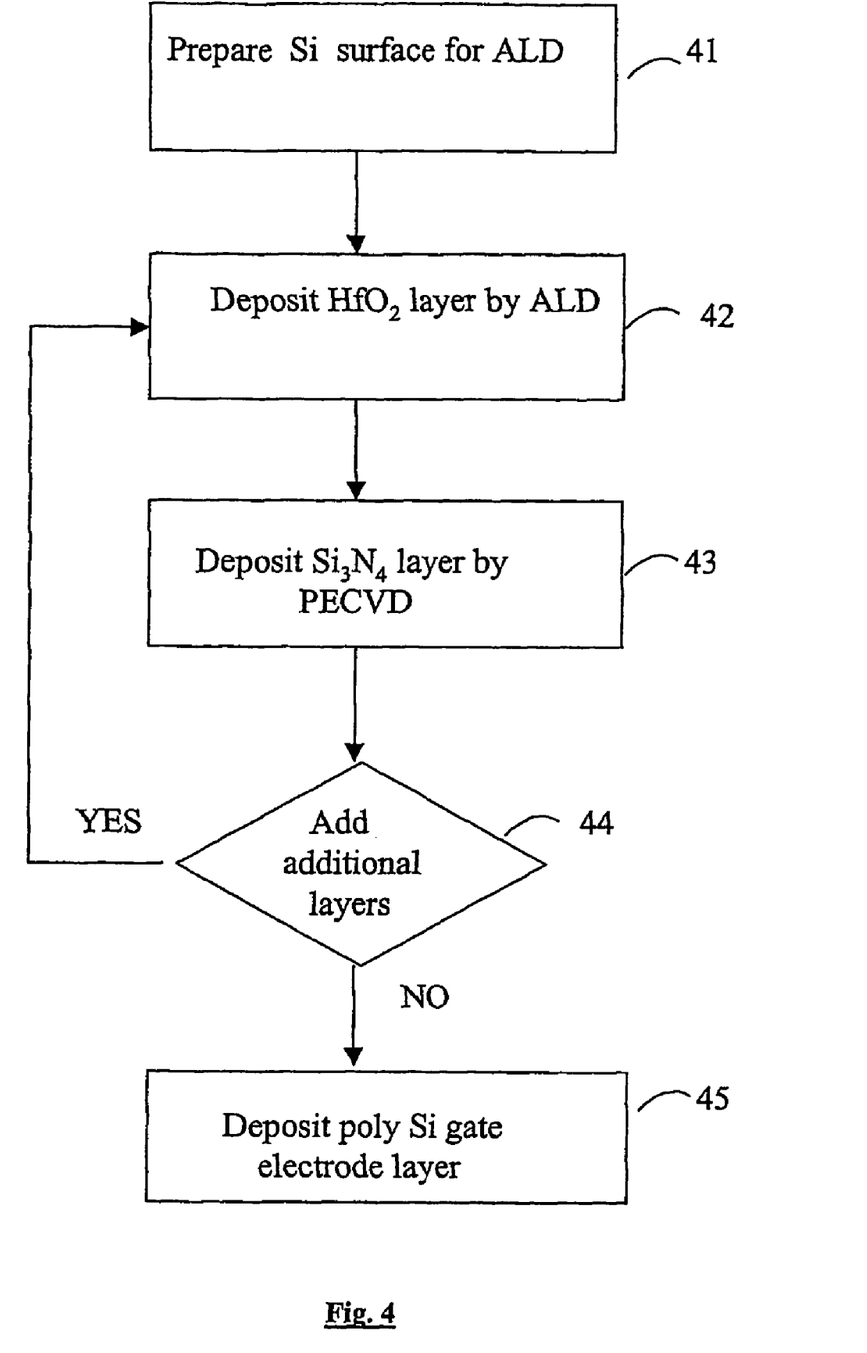

In a preferred embodiment, a method for forming a dielectric stack is formed. The dielectric stack comprises alternating layers of $HfO_2$, SiN and an intermediate layer comprising Hf, Si and N. The method is disclosed in FIG. 4. The method comprises the step of:

preparing a silicon surface for ALD (41);

forming a layer of $HfO_2$ by atomic layer chemical vapor deposition (ALCVD) on the silicon substrate (42);

subjecting the silicon substrate with the $HfO_2$ layer to a nitrogen containing species and a silicon containing species in a plasma enhanced chemical vapor deposition process (PECVD) (43), repeating step (42) and (43) n times, n being an integer between 0 and 100. Preferably, n is between 2 and 100, between 3 and 70, between 3 and 60, between 3 and 50, between 3 and 40, between 3 and 30, or between 2 and 10; and then depositing a poly Si gate electrode layer (45).

This method results in the formation of a dielectric stack consisting of alternating layers of $HfO_2$, SiN and an intermediate layer comprising Hf, Si and N. For the purpose of this invention, this dielectric stack will be referred to as the [$HfO_2$/SiN]xZ laminate stack. Z refers to the number of times that the stack $HfO_2$/SiN is repeated. This dielectric stack results in advantages obtained by 1) incorporation of silicon and nitrogen into the high-k material; 2) formation of an intermediate layer containing HfSiON. Consequently, high-k/polysilicon interface reaction is prevented and concurrently the thermal stability of the high-k material against crystallization is improved.

EXAMPLES

1. Deposition of Hafnium Dioxide ($HfO_2$) or Hafnium Oxynitride ($HfO_xN_y$) by Atomic Layer CVD (ALCVD)

Deposition of $1^{st}$ $HfO_2$ high-k layer is achieved by ALCVD which uses sequential exposure of the starting Si wafer surface to pulses of $HfCl_4$ and $H_2O$ precursors in a dedicated ALCVD reactor. ALCVD allows for precise $HfO_2$ thickness control down to (sub)monolayer level by self-limiting surface reactions during the $HfCl_4$ and $H_2O$ precursor exposure cycles, respectively.

Alternatively, deposition of $1^{st}$ $HfO_xN_y$ high-k dielectric is achieved by using sequential exposure of $HfCl_4$, $H_2O$ and/or $NH_3$ precursors in a dedicated ALCVD reactor. The oxygen-to-nitrogen ratio in the ALCVD $HfO_xN_y$ dielectric can be varied by controlling the $H_2O$ to $NH_3$ precursor cycle ratio after the prior $HfCl_4$ exposure cycle. In the case of using $NH_3$ precursor only, the ALCVD layer produced is pure hafnium nitride, HfN. Other precursors that can be used for producing $HfO_2$ or $HfO_xN_y$ include tetra-kis-diethylamido hafnium, TDEAH, $Hf[N(C_2H_5)_2]_4$ and ozone ($O_3$).

Alternative methods to produce $HfO_2$ or $HfO_xN_y$ thin dielectric layers are MOCVD or physical (sputter) deposition with suitable precursors or targets.

2. Deposition of Silicon Nitride (SiN) by Plasma-Enhanced CVD (PECVD)

Following the formation of $HfO_2$ high-k dielectric, an ultra-thin silicon (oxy)nitride cap or intermediate layer can be readily deposited, using a remote $N_2$-plasma plus a dilute silane ($SiH_4$) flow in a PECVD reactor that is clustered with the ALCVD reactor. Silicon and nitrogen species are incorporated into the upper part of the underlying high-k dielectric layer in this process. The above CVD processes are repeated twice to complete the fabrication of the stack.

3. Post Deposition Anneal (PDA)

A post deposition anneal step is performed to further improve the stack integrity and promote intermixing of material between the components. Final optimization of the dielectric stack composition in terms of nitrogen and oxygen content can be made by selecting either an oxidizing, nitridizing or inert ambient along with a suitable annealing temperature. Typical inert gas ambient includes $N_2$, Ar, He. Typical oxidizing ambient gas includes $O_2$, NO, $N_2O$. Typical nitridizing gas ambient without oxygen is $NH_3$.

Capacitor Leakage Experiments:

Capacitor leakage experiments were performed for device structures obtained via the method described above. The gate electrode is a conducting polysilicon gate electrode. The results of the experiments are shown in FIGS. 5 and 6.

Figure 5A:
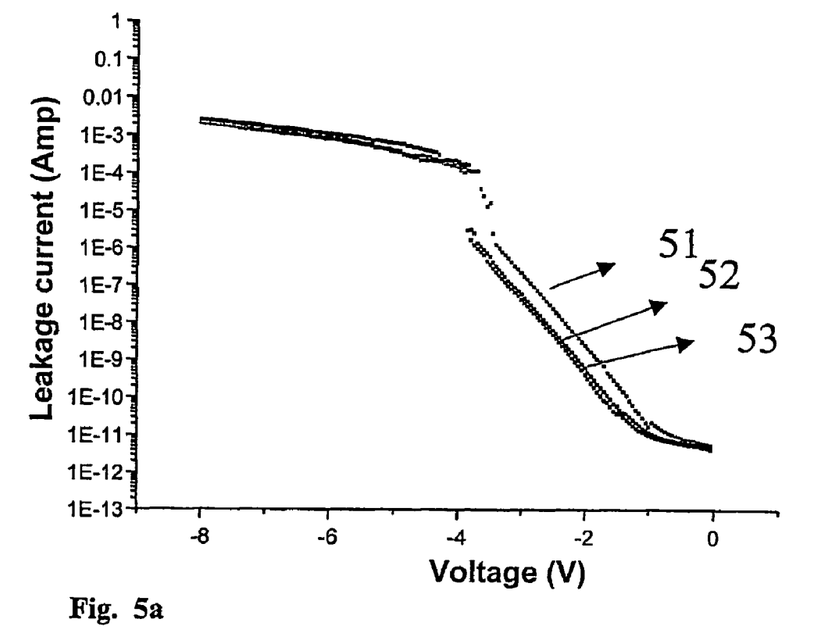
Figure 6A:
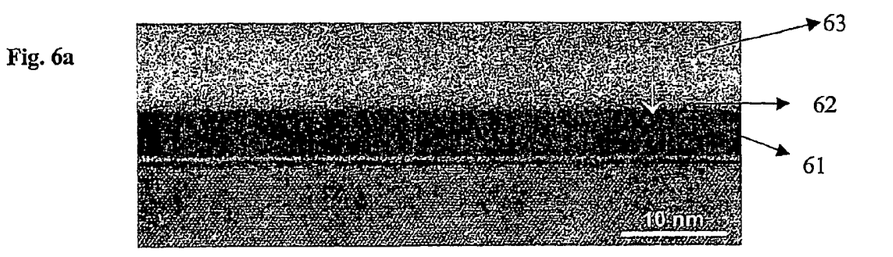
Figure 6B:
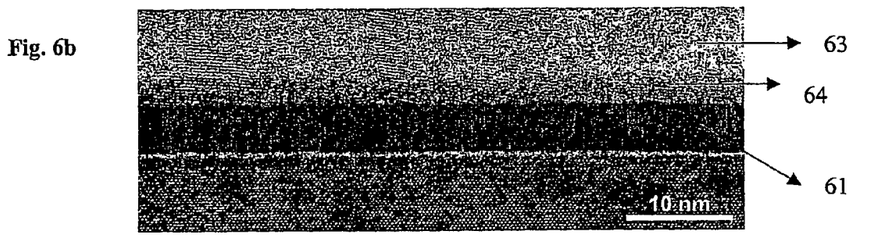

The devices comprising a dielectric stack are achieved according to the following methods:

FIG. 5*a*—Sequence of Steps:

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to a mixture of silane+MRG (microwave radical generator) $N_2$ plasma at 600 degrees C. for 15 seconds in a PECVD chamber, deposition of the poly silicon gate layer, and post gate electrode anneal at 1000 degrees C.

Figure 5B:
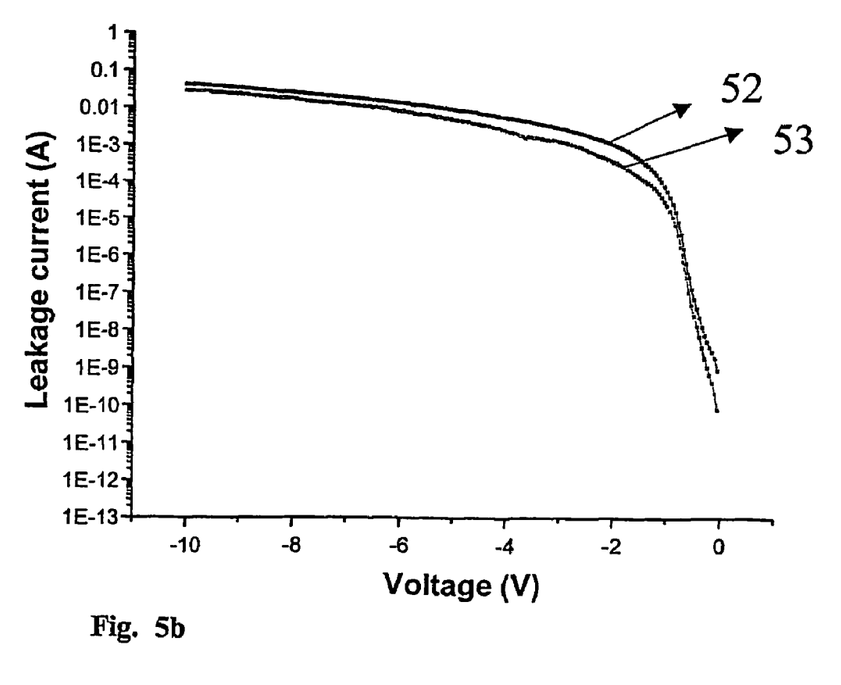

FIG. 5*b*—Sequence of Steps:.

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to silane without N2 plasma at 600 degrees C. for 15 seconds, deposition of the poly silicon gate layer, and post gate electrode anneal at 1000 degrees C.

Figure 5C:
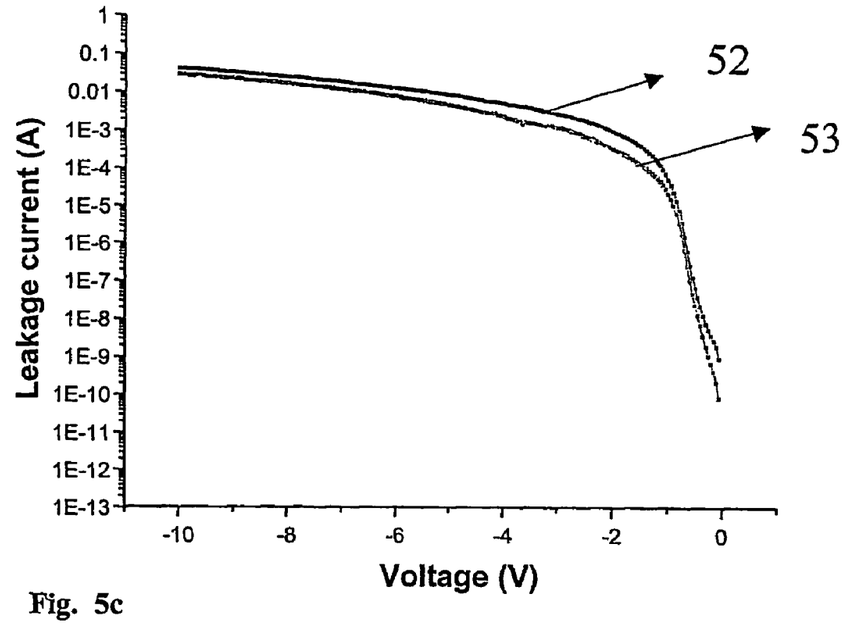

FIG. 5*c*—Sequence of Steps:

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to MRG $N_2$ plasma in a PECVD chamber at 600 degrees C. for 15 seconds, deposition of the poly silicon gate layer, and post gate electrode anneal at 1000 degrees C.

Figure 5D:
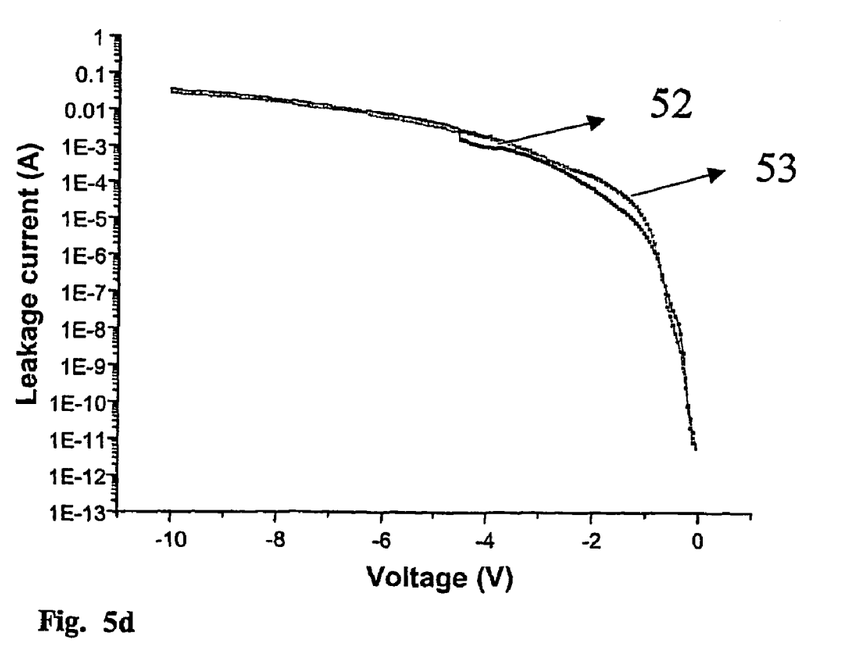

FIG. 5*d*—Sequence of Steps:

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to $N_2$ post deposition anneal (PDA) treatment at 600 degrees C. for 15 seconds, deposition of the poly silicon gate layer, and post gate electrode anneal at 1000 degrees C.

51 in FIG. 5 refers to devices with a 100 by 100 μm² device area, 52 refers to devices with a 50 by 50 μm² device area, 53 refers to devices with a 30 by 30 μm² device area.

Experiment 5a shows low leakage current capacitor devices with well-behaved area-scaling. In the next set of comparison experiments, the effects of (a) silane and nitrogen plasma exposure; (b) silane exposure only; (c) $N_2$-plasma exposure only and (d) $N_2$ post deposition anneal (PDA) on 4 nm $HfO_2$ are shown. A thermal silane exposure without the $N_2$-plasma (FIG. 5b) on 4 nm $HfO_2$ did not achieve the same low leakage current as in FIG. 5a. The plasma enhancement effect can be attributed to the enhanced reactivity of nitrogen-containing species produced by the plasma, either as ions or radicals. Energy released from ion bombardment or by radicals help to promote intermixing, densification and silicon/nitrogen incorporation into the $HfO_2$ high-k dielectric. The presence of both silicon and nitrogen contributes to ensure polysilicon compatibility of the 4 nm $HfO_2$ dielectric as a $N_2$-plasma treatment alone (FIG. 5c) or a $N_2$ post deposition anneal treatment (FIG. 5d) did not achieve the same low leakage current as the plasma CVD SiN-$HfO_2$ control (FIG. 5a). Thus, the incorporation of silicon and nitrogen into the $HfO_2$ from the $N_2$-plasma/silane plasma by plasma enhanced CVD process deposition process contributes to a dielectric stack with desired chemical composition and structural/electrical integrity.

Study of Interface Reactions

The effect of reduced interface reaction between polysilicon gate and high-k material is demonstrated in the cross-sectional TEM images shown in FIG. 6. FIG. 6a shows a TEM of a dielectric stack. The dielectric stack is obtained by the following method:

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to a mixture of silane+MRG (microwave radical generator) $N_2$ plasma at 600 degrees C. for 15 seconds in a PECVD chamber, deposition of the poly silicon gate layer, and post gate electrode anneal at 1000 degrees C.

In FIG. 6a, 61 refers to the $HfO_2$ layer, 62 refers to SiN layer and 63 refer to the poly Si gate electrode. The dielectric stack was obtained by the method as described for FIG. 5a. FIG. 6a shows that incorporation of silicon and nitrogen into bulk of the $HfO_2$ or $HfO_xN_y$ high-k dielectric layers results in the formation of an intermediate layer of hafnium-silicon oxynitride (HfSiON), leading to improved overall structural integrity and enhanced thermal stability against interface reaction with polysilicon (gate electrode). The intermediate layer formation occurs due to the plasma action from the deposition of the silicon oxynitride by plasma enhanced chemical vapor deposition. Relative ratio of Hf, O, Si, and N components can be adjusted by individual layer thickness and deposition parameters.

FIG. 6b shows a TEM image of a dielectric stack obtained by the method treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, deposition of the poly silicon gate layer, and post gate electrode anneal at 1000 degrees C.

In FIG. 6b, 61 refer to the $HfO_2$ layer, 64 refer to a gray contrast haze layer, and typical for the $HfO_2$/polySi interface due to interface reaction and 63 refers to the poly Si gate electrode.

The silicon-rich SiN layer 62 of FIG. 6a, between the $HfO_2$ layer and polisilicon gate electrode, provides an effective barrier to prevent undesired interfacial reaction between $HfO_2$ and polysilicon (gate electrode) compared to any $HfO_2$, $HfO_xN_y$, or HfSiON based single layer dielectric.

Figure 7:
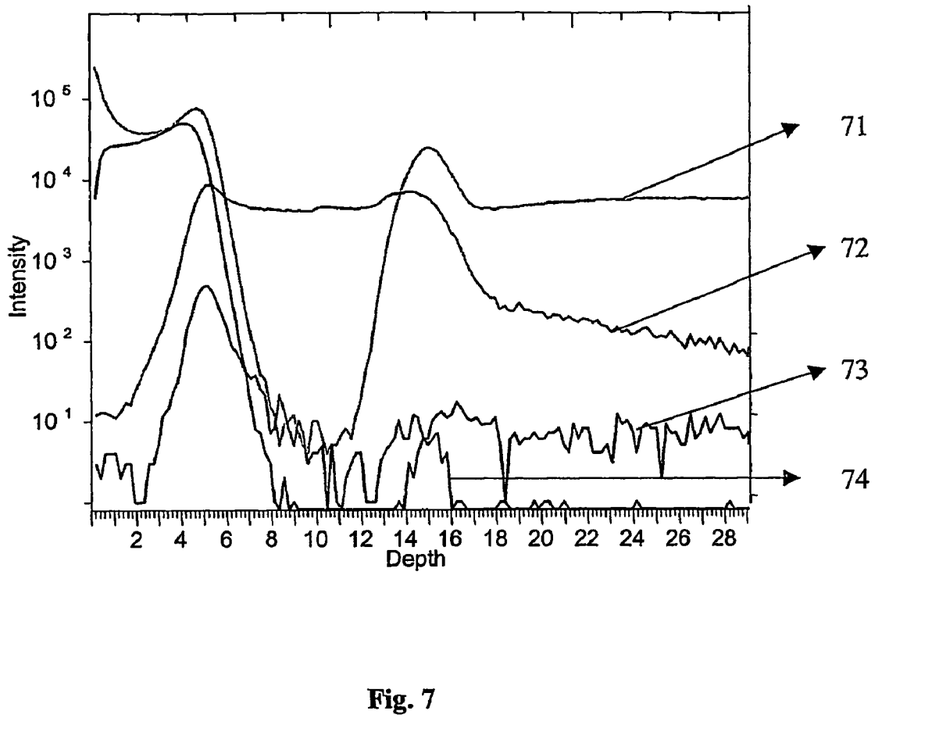

An example of the intermixing of the high-k layer with silicon and nitrogen is described in the ToF SIMS depth profiles shown in FIG. 7.

The dielectric stacks are obtained by the method:

treating Si substrate to a mixture of $O_3$ and DI water to obtain an —OH terminated surface, subjecting Si substrate subsequently to $HfCl_4$ and $H_2O$ precursors (one cycle) in ALD chamber, repeat this up to a total of 80 cycles, resulting in a layer of $HfO_2$ of approximate thickness of 4 nm, subjecting Si substrate with $HfO_2$ layer to a mixture of silane+MRG (microwave radical generator) $N_2$ plasma for 150 seconds in a PECVD chamber at 600 degrees C., resulting in a layer of SiN (thickness approximately 5 nm), deposition of the poly silicon gate layer, and post gate electrode anneal at 1000 degrees C.

TOF-SIMS depth profiles show the presence of $HfN^+$ secondary ions (74). 71 refers in this figure to Si, 72 refers to Hf and 73 refers to $SiN_2$, indicating the presence of an intermediate Hf(Si)-oxynitride layer between the $HfO_2$ layer and the SiN layer.

Figure 8A:
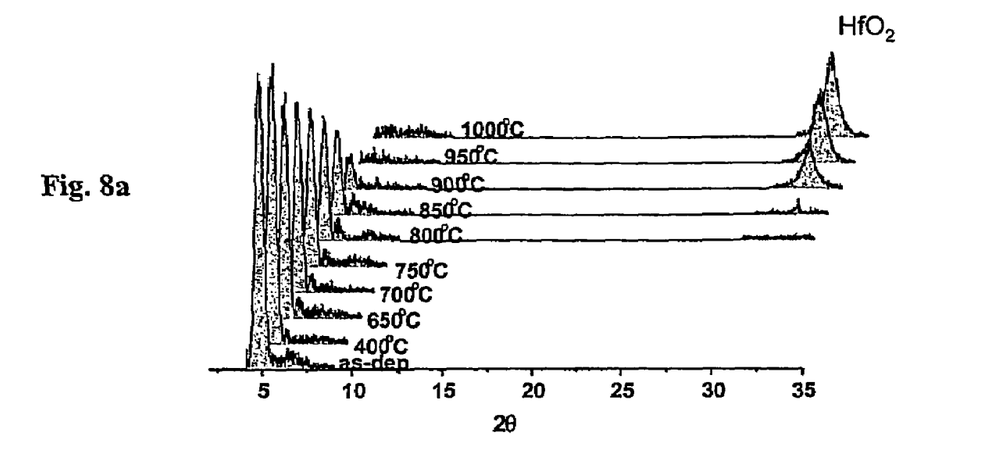
Figure 8B:
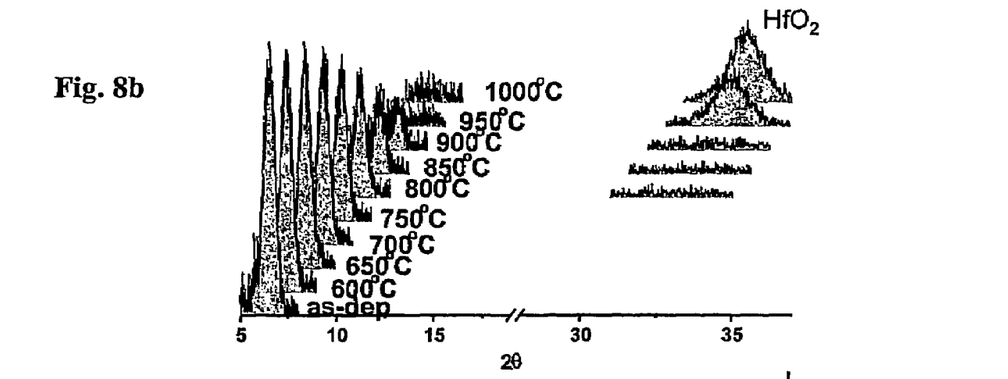
Figure 8C:
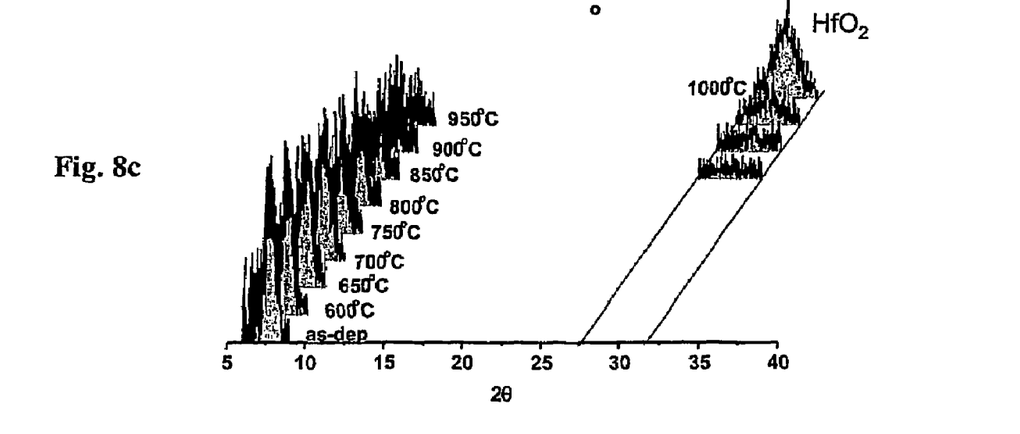

Experimental results on crystallization temperature of the dielectric stack are shown in FIG. 8.

Binary oxides such as $ZrO_2$ and $HfO_2$ have a crystallization onset temperature between 450-550 degrees C. The [$HfO_2$/SiN] laminate approach significantly increases the crystallization onset temperature to 900-1000 degrees C. FIG. 8a-c show the x-ray diffraction spectra of the [$HfO_2$/SiN]x10 laminate structure with 30 (FIG. 8a), 20 (FIG. 8b) and 15 cycles (FIG. 8c) of $HfCl_4$/$H_2O$ and 0.5 nm SiN (repeated 10 times). Diffraction peaks located between 5-10 degrees 2-theta angle represent reflections from the individual laminated [$HfO_2$/SiN] layers. As a function of increasing annealing temperature, a second x-ray diffraction peak located between 2-theta angle of 29-31 degrees start to emerge at or above 900° C., indicating the crystallization of the $HfO_2$ phase-separated from [$HfO_2$/SiN] laminate.

The dielectric stacks were obtained according to the method:

treating Si substrate to a mixture of $O_3$ and DI water to obtain an —OH terminated surface, performing 10 times the sequence of steps:

subjecting Si substrate subsequently to $HfCl_4$ and $H_2O$ precursors (one cycle) in ALD chamber, repeat this up to a total of y cycles, resulting in layer of $HfO_2$, and subjecting Si substrate with $HfO_2$ layer to a mixture of silane+MRG (microwave radical generator) $N_2$ plasma in a PECVD chamber at 550 degrees C., resulting in a layer of SiN.

Hereby, y=30 (FIG. 8a), y=20 (FIG. 8b), y=15 (FIG. 8c).

Figure 9:
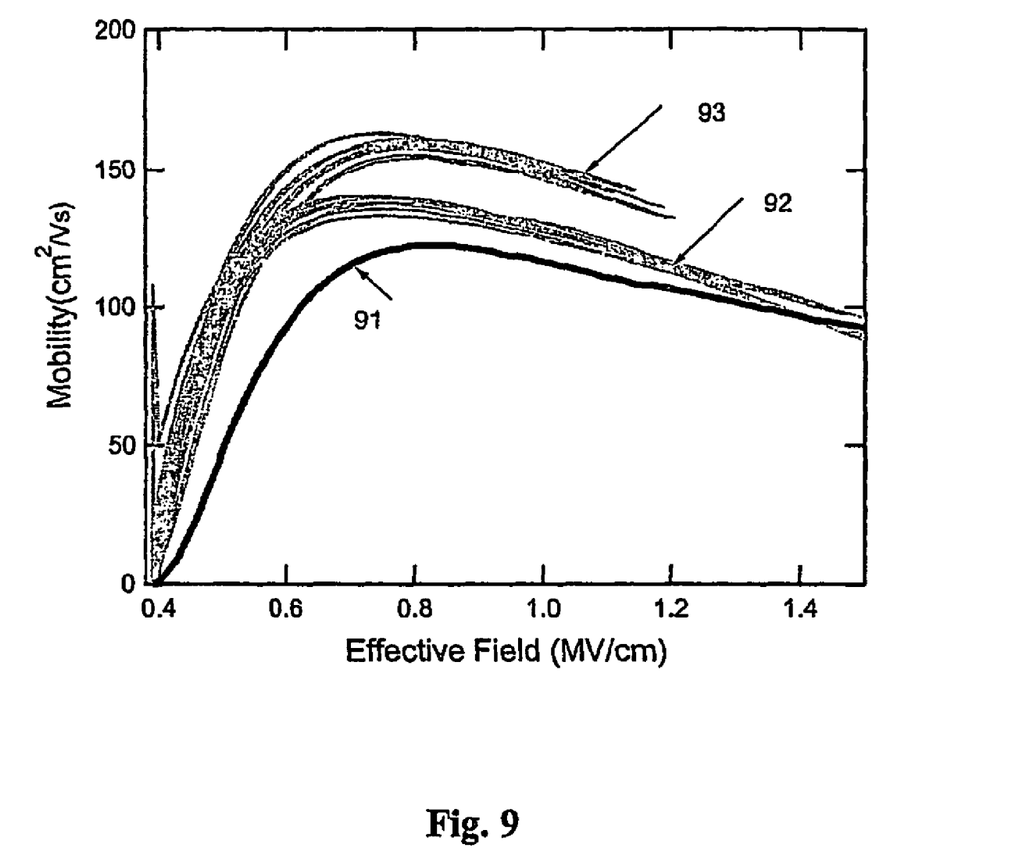

FIG. 9 shows channel electron mobility measurements from nMOSFET devices fabricated with HfO$_2$ (91), HfO$_2$/SiN (92), and [HfO$_2$/SiN]x2 (z=2) laminate (93) as dielectric stack. It can be seen that the [HfO$_2$/SiN]x2 laminate (93) and the HfO$_2$/SiN (92) has a higher peak and overall mobility compared to the HfO$_2$ reference (91).

The dielectric stacks are obtained by the method of:
treating Si substrate to a mixture of O$_3$ and DI water to obtain an —OH terminated surface,
subjecting Si substrate subsequently to HfCl$_4$ and H$_2$O precursors (one cycle) in ALD chamber, (up to a total of 80 cycles for condition 91, 60 cycles for condition 92, 20 cycles for condition 93) resulting in layer of HfO$_2$,
subjecting Si substrate with HfO$_2$ layer to a mixture of silane+MRG (microwave radical generator) N$_2$ plasma in a PECVD chamber at 550 degrees C., resulting in a layer of SiN deposition of the poly silicon gate layer (only for condition 92 and 93), and optionally
repeating both subjecting steps once (only for condition 93).

Figure 10:
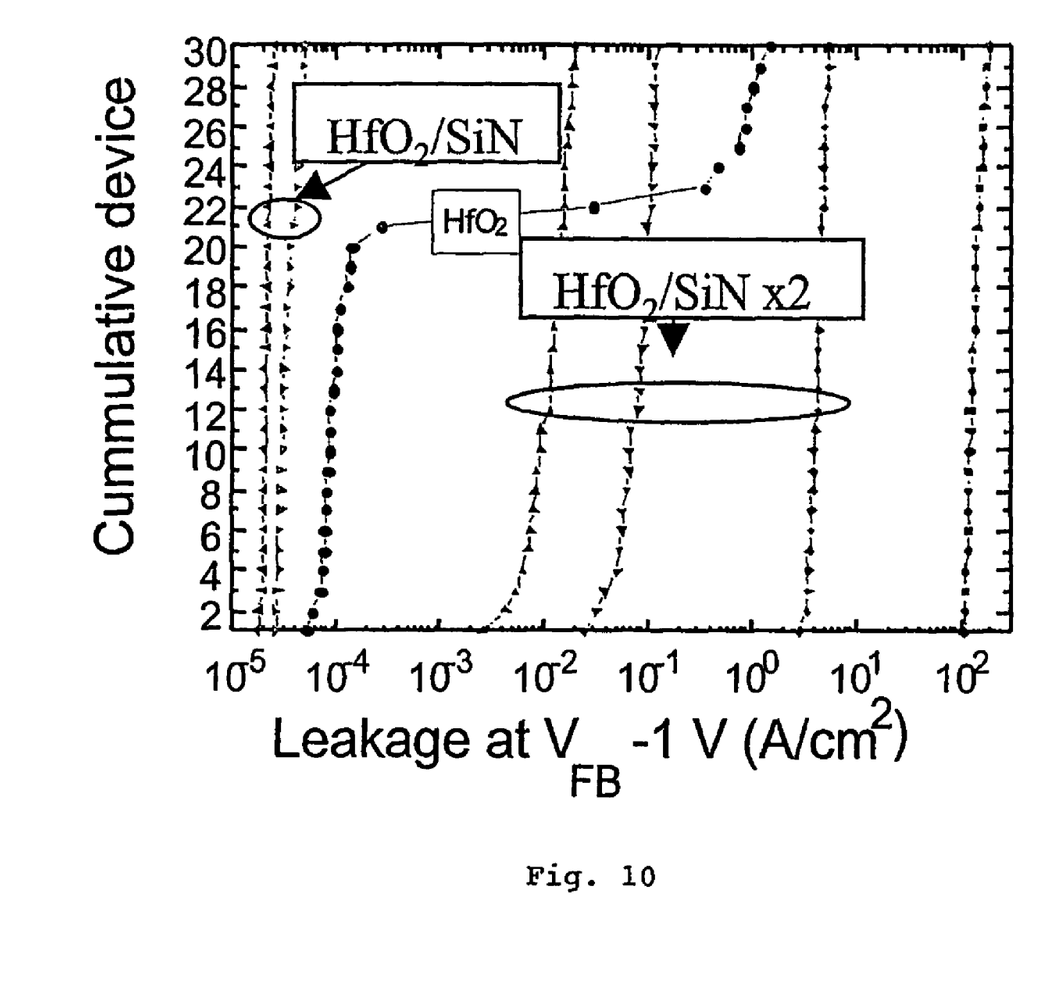

FIG. 10 show the cumulative distribution of gate leakage current for a sample of 30 diode/capacitor devices. The devices are obtained according to method described above (conditions 91, 92 and 93 in FIG. 9). Both the HfO$_2$/SiN and [HfO$_2$/SiN]x2 (z=2) devices give near 100% yield whereas about 30% HfO$_2$ devices fail the leakage distribution trend.

What is claimed is:

1. A method for fabricating a dielectric stack in an integrated circuit, the method comprising the steps of:
    forming a high-k dielectric layer on a semiconductor substrate;
    exposing the high-k dielectric layer on the semiconductor substrate to a vapor phase reactant comprising nitrogen and a vapor phase reactant comprising silicon in a plasma-enhanced chemical vapor deposition process or a plasma-enhanced atomic layer chemical vapor deposition process at a temperature of from 300 degrees Celsius to 600 degrees Celsius so as to form a dielectric layer comprising silicon and nitrogen and essentially no high-k material and an intermediate layer disposed between the high-k dielectric layer and the dielectric layer, the intermediate layer comprising The high-k material, silicon, and nitrogen, whereby a dielectric stack is fabricated, wherein a crystallization temperature of the dielectric stack is higher than a crystallization temperature of the high-k dielectric layer and higher than 600 degrees C., such that integrity degradation of the high-k dielectric due to crystallization is minimized; and
    depositing a polysilicon conducting layer atop the dielectric layer, wherein essentially no high-k material is in contact with the polysilicon conducting layer such that reaction between The high-k dielectric and the polysilicon is prevented, whereby thermal stability of the high-k dielectric against crystallization is increased.

2. The method according to claim 1, further comprising the step of:
    exposing the high-k dielectric layer on the semiconductor substrate of a vapor phase reactant comprising oxygen.

3. The method according to claim 1, wherein the forming step and the exposing step are repeated from 2 times to 50 times.

4. The method according to claim 1, wherein the high-k dielectric layer comprises a high-k material selected from the group consisting of a transition metal oxide and a transition metal oxynitride.

5. The method according to claim 1, wherein the high-k dielectric layer comprises a high-k material selected from the group consisting of ZrO$_2$, HfO$_2$, TiO$_2$, Ta$_2$O$_5$, Al$_2$O$_3$, HfO$_x$N$_y$, HfN, and mixtures thereof.

6. The method according to claim 1, wherein the forming step comprises subjecting the semiconducting substrate to an atomic layer deposition process.

7. The method according to claim 1, wherein the exposing step is performed in a plasma-enhanced chemical vapor deposition chamber.

8. The method according to claim 1, wherein the exposing step is performed in a plasma-enhanced atomic layer vapor deposition chamber.

9. The method according to claim 1, wherein the exposing step is performed at a pressure of from $10^{-3}$ Torr to 100 Torr.

10. The method according to claim 1, wherein the exposing step is performed in a plasma with a plasma density of from $10^{10}$ cm$^{-3}$ to $10^{13}$ cm$^{-3}$.

11. The method according to claim 1, wherein the vapor phase reactant comprising silicon is selected from the group consisting of SiH$_4$, Si$_2$H$_6$, Si$_3$H$_8$, Si$_x$H$_y$Cl$_z$, and combinations thereof.

12. The method according to claim 1, wherein the nitrogen comprising vapor phase reactant is selected from the group consisting of nitrogen, ammonia, N$_2$H$_4$, NO, N$_2$O, and combinations thereof.

13. The method according to claim 1, wherein the high-k dielectric layer has a thickness of from 0.5 nm to 20 nm.

14. The method according to claim 1, wherein the dielectric layer has a thickness of from 0.5 nm to 20 nm.

15. The method according to claim 1, wherein the conducting layer is an electrode.

\* \* \* \* \*

UNITED STATES PATENT AND TRADEMARK OFFICE
CERTIFICATE OF CORRECTION

PATENT NO. : 7,465,626 B2  Page 1 of 1
APPLICATION NO. : 11/138746
DATED : December 16, 2008
INVENTOR(S) : Chen et al.

It is certified that error appears in the above-identified patent and that said Letters Patent is hereby corrected as shown below:

| Issued Patent | | 1. Description of Error |
|---|---|---|
| Column | Line | |
| Page 1 Item (56) Col. 2 | 10 | Under Other Publications, change "amd" to --and--. |
| Page 1 Item (56) Col. 2 | 11 | Under Other Publications, before "vol." delete "Electrochemical Society". |
| Page 1 Item (56) Col. 2 | 12 | Under Other Publications, change "17661;" to --1766;--. |
| 10 | 25 (Approx). | change "O3" to --$O_3$--. |
| 10 | 45 | change "N2" to --$N_2$--. |
| 11 | 65 | After "method" insert --:--. |
| 13 | 43 (Approx.) | In Claim 1, change "The" to --the--. |
| 14 | 4 | In Claim 1, change "The" to --the--. |
| 14 | 10 | In Claim 2, change "of" to --to--. |
| 14 | 29 | In Claim 8, after "layer" insert --chemical--. |

Signed and Sealed this

Fifth Day of May, 2009

JOHN DOLL
*Acting Director of the United States Patent and Trademark Office*